(12) United States Patent
Nakazawa et al.

(10) Patent No.: US 7,378,329 B2
(45) Date of Patent: May 27, 2008

(54) METHOD FOR MANUFACTURING SEMICONDUCTOR DEVICE

(75) Inventors: Keisuke Nakazawa, Yokohama (JP); Soichi Yamazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 10/933,227

(22) Filed: Sep. 3, 2004

(65) Prior Publication Data
US 2005/0277208 A1 Dec. 15, 2005

(30) Foreign Application Priority Data
Jun. 9, 2004 (JP) ............................... 2004-171084

(51) Int. Cl.
*H01G 7/06* (2006.01)
(52) U.S. Cl. .......................... 438/396; 438/3; 438/381
(58) Field of Classification Search .................... 438/3, 438/381, 393, 396
See application file for complete search history.

(56) References Cited

U.S. PATENT DOCUMENTS

| | | | | |
|---|---|---|---|---|
| 6,388,281 | B1 * | 5/2002 | Jung et al. | 257/295 |
| 6,586,790 | B2 | 7/2003 | Kanaya et al. | |
| 2001/0051381 | A1 * | 12/2001 | Yang et al. | 438/3 |
| 2003/0137051 | A1 * | 7/2003 | Kawai | 257/758 |
| 2003/0176073 | A1 * | 9/2003 | Ying et al. | 438/710 |
| 2004/0137648 | A1 * | 7/2004 | An | 438/3 |

FOREIGN PATENT DOCUMENTS

| | | |
|---|---|---|
| JP | 2000-164817 | 6/2000 |
| JP | 2001-44376 | 2/2001 |
| JP | 3400964 | 2/2003 |
| JP | 2003-100592 | 4/2003 |
| JP | 2003-229542 | 8/2003 |
| JP | 2003-273323 | 9/2003 |
| JP | 2004-55619 | 2/2004 |

(Continued)

OTHER PUBLICATIONS

Shinji Kishimura, et al., "ArF excimer laser lithography with bottom antireflective coating", SPIE, vol. 3334, 1998, pp. 310-321.

(Continued)

*Primary Examiner*—Zandra V. Smith
*Assistant Examiner*—Pamela E Perkins
(74) *Attorney, Agent, or Firm*—Oblon, Spivak, McClelland, Maier & Neustadt, P.C.

(57) ABSTRACT

Disclosed is a method for manufacturing a semiconductor device, comprising forming an insulating film above a semiconductor substrate having an element formed thereon, forming an anti-reflection layer that is impermeable to hydrogen on the insulating film, the anti-reflection layer comprising a layer formed of at least one material selected from the group consisting of silicon nitride, silicon oxynitride, chromium oxide, $CrO_xF_y$, $CrAl_xO_y$, $AlSi_xO_y$, $ZrSi_xO_y$, silicon oxycarbide, carbon, chromium nitride, titanium nitride, tantalum nitride, aluminum nitride, $TiAl_xN_y$, $TaAl_xN_y$, $TiSi_xN_y$, $AlSi_xN_y$ (where x and y denote the component ratio), and silicon carbide, forming a resist pattern on the anti-reflection layer, forming a hole in the insulating film with the resist pattern used as a mask, burying a conductive material in the hole to form a plug, removing the resist pattern, and forming a ferroelectric capacitor above the anti-reflection layer.

8 Claims, 13 Drawing Sheets

FOREIGN PATENT DOCUMENTS

JP    2004-134692    4/2004

OTHER PUBLICATIONS

W.M. Arboldbik, et al., "Dynamic behavior of hydrogen in silicon nitride and oxynitride films made by low-pressure chemical vapor deposition", Physical Review B, vol. 48, No. 8, Aug. 15, 1993, pp. 5444-5456.

M.R. Piggott, et al., "Hydrogen Diffusion through Oxide Films on Steel", Journal of the Iron and Steel Institute, vol. 210, Dec. 1972, pp. 901-905.

N. Bazzanella, et al., "High temperature efficient deuterium permeation and oxidation (Al, Ti)N barriers deposited on stainless steel", Applied Physics Letters, vol. 81, No. 20, Nov. 11, 2002, pp. 3762-3764.

\* cited by examiner

METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2004-171084, filed Jun. 9, 2004, the entire contents of which are incorporated herein by reference.

BACKGROUND OF THE INVENTION

1. Field of the Invention

The present invention relates to a method for manufacturing a semiconductor device, particularly, to a method for manufacturing a semiconductor device including a ferroelectric capacitor.

2. Description of the Related Art

A ferroelectric material such as lead zirconate titanate (PZT) or strontium bismuth tantalate (SBT) is used for forming a capacitor included in a ferroelectric memory. Such a ferroelectric material is weak against a reducing atmosphere such as a hydrogen atmosphere. If the ferroelectric material noted above is exposed to a hydrogen atmosphere, the oxygen atoms contained in the crystal of the ferroelectric material are extracted, with the result that the ferroelectric material fails to sufficiently exhibit a spontaneous polarization.

The conventional method for manufacturing a ferroelectric capacitor comprises, for example, the step of forming successively a lower electrode, a ferroelectric thin film and an upper electrode so as to form a laminate structure, followed by forming a hydrogen-resistant barrier film on the laminate structure. Then, a hard mask (HM) made of, for example, silicon dioxide is formed on the hydrogen-resistant barrier film, followed by processing the laminate structure in a desired pattern by a lithography process. In the lithography process, an organic anti-reflection layer is formed in general in order to prevent the reflection of the exposure light beam. Then, a photoresist film is formed so as to carry out the light exposure treatment. Each of the anti-reflection layer and the photoresist film can be formed by the coating of a material and the drying of the coated material, with the result that the manufacturing process can be simplified. After formation of a capacitor of a desired shape, the anti-reflection layer and photoresist film are removed by an oxygen plasma asher. What should be noted is that, during the treatment with the asher, a hydrogen gas is formed by the hydrogen atoms contained in the photoresist film and the anti-reflection layer. In other words, a hydrogen gas is generated during the treatment with the asher. The hydrogen gas thus generated is diffused through the HM (hard mask) to the ferroelectric capacitor. As a result, done to the capacitor is damaged.

After formation of the capacitor, metal wirings are formed with an interlayer insulating film interposed therebetween. A lithography process is also performed similarly in the step of forming the metal wirings. In the case of forming, particularly, a Cu wiring, a hydrogen annealing is performed in some cases as a pretreatment. It is possible for the hydrogen annealing to be a factor inducing damage to the capacitor.

In the case where a ferroelectric capacitor is formed on a transistor with an oxide film such as TEOS interposed therebetween, the capacitor is covered with a hydrogen barrier film such as $Al_2O_3$ in order to protect the capacitor from the hydrogen generated from the interlayer insulating film or in the step of forming the metal wiring. However, hydrogen permeates through the TEOS film formed in a lower portion or the TEOS film exposed to the outside in the step of forming the metal wiring and reaches the capacitor. As a result, the capacitor is damaged. It is possible to avoid the problem noted above if a hydrogen barrier is interposed between the TEOS film and the lower electrode. In this case, however, the number of manufacturing process steps and the manufacturing cost are increased.

BRIEF SUMMARY OF THE INVENTION

A method for manufacturing a semiconductor device according to one aspect of the present invention comprises forming an insulating film above a semiconductor substrate having an element formed thereon; forming an anti-reflection layer that is impermeable to hydrogen on the insulating film, the anti-reflection layer comprising a layer formed of at least one material selected from the group consisting of silicon nitride, silicon oxynitride, chromium oxide, $CrO_xF_y$, $CrAl_xO_y$, $AlSi_xO_y$, $ZrSi_xO_y$, silicon oxycarbide, carbon, chromium nitride, titanium nitride, tantalum nitride, aluminum nitride, $TiAl_xN_y$, $TaAl_xN_y$, $TiSi_xN_y$, $AlSi_xN_y$ (where x and y denote the component ratio), and silicon carbide; forming a resist pattern on the anti-reflection layer; forming a hole in the insulating film with the resist pattern used as a mask; burying a conductive material in the hole to form a plug; removing the resist pattern; and forming a ferroelectric capacitor above the anti-reflection layer.

A method for manufacturing a semiconductor device according to another aspect of the present invention comprises forming an insulating film above a semiconductor substrate having an element formed thereon; successively depositing a lower electrode, a ferroelectric film and an upper electrode on the insulating film to form a ferroelectric capacitor; forming an anti-reflection layer that is impermeable to hydrogen on the upper electrode, the anti-reflection layer comprising a layer formed of at least one material selected from the group consisting of silicon nitride, silicon oxynitride, chromium oxide, $CrO_xF_y$, $CrAl_xO_y$, $AlSi_xO_y$, $ZrSi_xO_y$, silicon oxycarbide, carbon, chromium nitride, titanium nitride, tantalum nitride, aluminum nitride, $TiAl_xN_y$, $TaAl_xN_y$, $TiSi_xN_y$, $AlSi_xN_y$ (where x and y denote the component ratio), and silicon carbide; forming a resist pattern on the anti-reflection layer; patterning the ferroelectric capacitor with the resist pattern used as a mask; and removing the resist pattern.

DETAILED DESCRIPTION OF THE INVENTION

Some embodiments of the present invention will now be described with reference to the accompanying drawings.

Embodiment 1

FIGS. 1 to 8 are cross sectional views collectively showing the process steps included in the manufacturing method of a semiconductor device according to embodiment 1 of the present invention.

Figure 1:
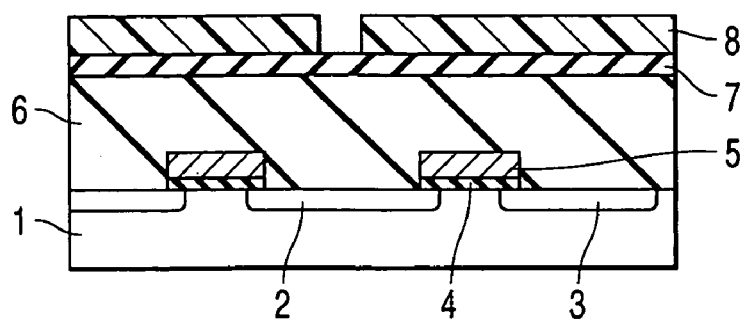
FIG. 1 is a cross sectional view showing a process step included in the manufacturing method of a semi-conductor device for embodiment 1 of the present invention.

In the first step, an interlayer insulating film 6 and an anti-reflection layer (ARC) 7 that is impermeable to hydrogen are formed successively on a semiconductor substrate 1, followed by forming a resist pattern 8 in direct contact with the ARC 7, as shown in FIG. 1. Formed in the semiconductor substrate 1 is a transistor including a source region 2, a drain region 3, a gate insulating film 4, and a gate electrode 5. It is possible to use, for example, TEOS for forming the interlayer insulating film 6.

The ARC 7 is required to resist permeation of hydrogen. To be more specific, if the hydrogen diffusion coefficient of a layer at 700° C. is less than $10^{-11}$ cm$^2$/s, the layer can be substantially regarded as resisting permeation of hydrogen. In embodiment 1 of the present invention, the ARC 7 is formed of an insulating material. However, it is also possible to form the ARC 7 by using a conductive material, depending on the structure of the capacitor. The insulating material that can be used for forming the ARC 7 includes, for example, silicon nitride such as $Si_3N_4$, silicon oxynitride such as SiON, chromium oxide such as $Cr_2O_3$, $CrO_xF_y$, $CrAl_xO_y$, $AlSi_xO_y$, and $ZrSi_xO_y$, where x and y denote the component ratio. Depending on the composition, it is possible to use silicon oxycarbide such as SiOC as the insulating material. These materials can be used singly or in the form of a mixture of at least two of these materials. Among these insulating materials, silicon oxynitride having a value of, for example, (O/(O+N)), which falls within a range of between 0.2 and 0.3, is known to exhibit the smallest value of a hydrogen diffusion coefficient at 700° C. To be more specific, the silicon oxynitride noted above exhibits the hydrogen diffusion coefficient of 0.5 to $2 \times 10^{-17}$ cm$^2$/s, as reported in "W. M. Arnoldbik et al. Phys. Rev. B48, 5444 (1993)". Also, it is reported in "M. R. Piggott, J. Iron Steel Inst. 210, 901 (1972)" that the hydrogen diffusion coefficient of $Cr_2O_3$ at 700° C. is $9.2 \times 10^{-16}$ cm$^2$/s. For conductive materials, the hydrogen diffusion coefficient of, for example, (Ti, Al)N at 450 to 600° C. is $1 \times 10^{-12}$ to $1 \times 10^{-11}$ cm$^2$/s, as reported in "N. Bazzanella et al. Appl. Phys. Lett. 81, 3762 (2002)".

Since the ARC 7 is required to inhibit the reflection of the exposure light beam, it is desirable for the ARC 7 to have optical constants including a refractive index n falling within a range of between about 1.0 and 2.2 under the wavelength of the exposure light beam and an attenuation coefficient k falling within a range of between about 0.2 and 1.0. Concerning the typical optical constants of, for example, SiON, the refractive index n is 2.0 and the attenuation coefficient k is 0.6. Also, regarding the optical constants of $Cr_2O_3$, the refractive index n is 1.85 and the attenuation coefficient k is 0.83 for the ArF light exposure. The optical constants are dependent on the wavelength and, thus, the refractive index n and the attenuation coefficient k are not limited to the values given above. In short, it suffices for the reflection of the light to the resist to be sufficiently small, i.e., not higher than about 5%, so as to suppress the standing wave of the resist after the development.

The ARC 7 is formed by controlling the element ratio of the compound used and the film thickness in a manner to satisfy the conditions given above. It is desirable to form the ARC 7 by the method that does not generate hydrogen such as a sputtering method. The thickness of the ARC 7 is determined by the optical constants of the material used and the wavelength. In order to suppress the fluctuation of the size after the development of the photoresist, the fluctuation being caused by the unevenness of the film thickness, it is desirable to form the ARC 7 to a thickness not less than about 50 nm. However, if the ARC 7 is excessively thick, the etching treatment may be rendered difficult to perform. Such being the situation, it is desirable for the upper limit of the thickness of the ARC 7 to be about 100 nm.

Figure 2:
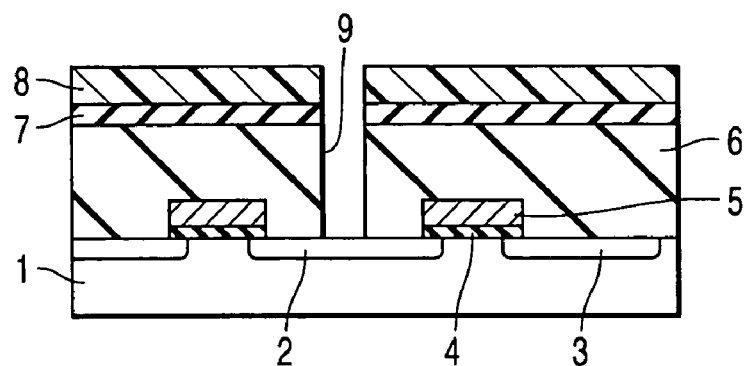
FIG. 2 is a cross sectional view showing the process step following the step shown in FIG. 1.
Figure 3:
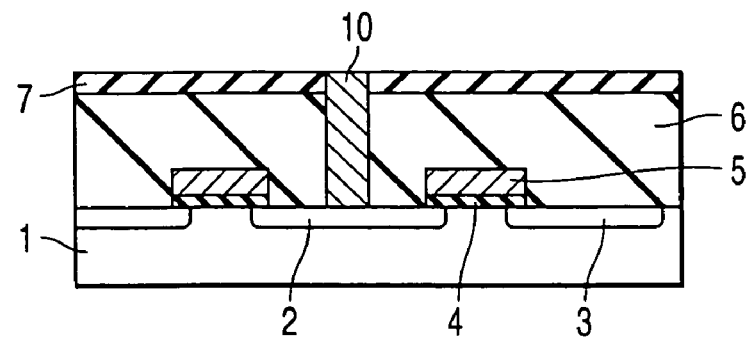
FIG. 3 is a cross sectional view showing the process step following the step shown in FIG. 2.

The laminate structure including the ARC 7 and the interlayer insulating film 6 is etched by the ordinary method with the resist pattern 8 used as a mask so as to form a hole 9 as shown in FIG. 2. A conductive material such as tungsten or polycrystalline silicon (polysilicon) is buried in the hole 9, followed by applying a planarizing treatment (CMP) to form a plug 10. Further, the resist pattern 8 is peeled off by an ashing treatment so as to cause the ARC 7 to be exposed to the outside, as shown in FIG. 3.

Figure 4:
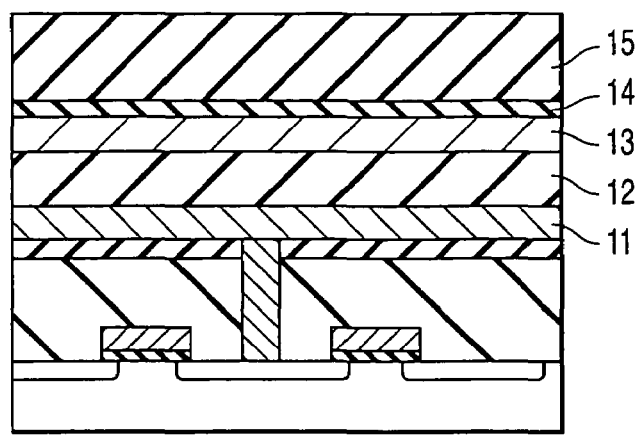
FIG. 4 is a cross sectional view showing the process step following the step shown in FIG. 3.

As shown in FIG. 4, a lower electrode 11, a ferroelectric film 12 and an upper electrode 13 are successively formed on the ARC 7. It is possible for each of the lower electrode 11 and the upper electrode 13 to be formed of a noble metal such as Pt, Ir, or Pd, or a conductive oxide material such as $SrRuO_3$ or $IrO_2$. A film of each of these materials can be formed by, for example, a sputtering method or an MOCVD method and can be used singly or as a member of a laminate structure. Each of the lower electrode 11 and the upper electrode 13 has a thickness of about 100 nm in general. On the other hand, a material selected from the group consisting of PZT, SBT, BLT (bismuth lanthanum titanate) and BIT (bismuth titanate) can be used for forming the ferroelectric film 12. The ferroelectric film 12 can be formed by a sputtering method, a coating method or a MOCVD method, followed by crystallizing the formed film. In the case of PZT is used, the ferroelectric film 12 can be formed by depositing a film having a thickness of several 10 nm to several 100 nm, followed by heat treating at the temperature of 500 to 700° C. to crystallize.

Figure 5:
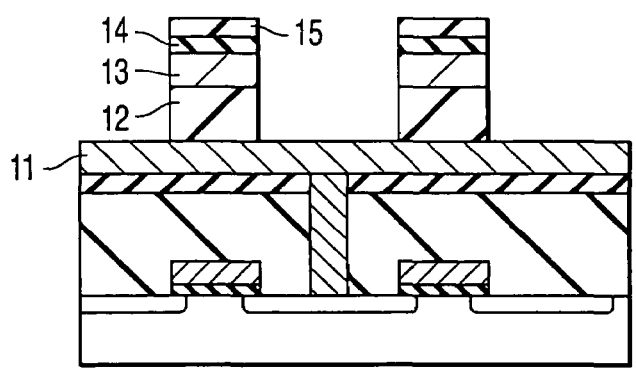
FIG. 5 is a cross sectional view showing the process step following the step shown in FIG. 4.

A reduction resistant film is formed as a hydrogen barrier film 14 on the upper electrode 13. To be more specific, an $Al_2O_3$ film is formed to a thickness of 10 nm by a vapor deposition method, followed by forming a TEOS film as a hard mask 15 on the $Al_2O_3$ film so as to obtain the structure shown in FIG. 4. The hydrogen barrier film 14 can be formed by, for example, a sputtering method or an ALD (Atomic Layer Deposition) method. In addition to $Al_2O_3$, it is also possible to use, for example, TiN or TiAlN for forming the hydrogen barrier film 14. Further, the hard mask 15 can be formed by, for example, a CVD (Chemical Vapor Deposition) method. The hard mask 15, the hydrogen barrier film 14, the upper electrode 13 and the ferroelectric film 12 are processed by the ordinary lithography method so as to obtain a patterned capacitor as shown in FIG. 5. In the structure shown in FIG. 5, the lower electrode 11 is shared by the two capacitors. However, it is also possible to form a lower electrode for each capacitor.

Figure 6:
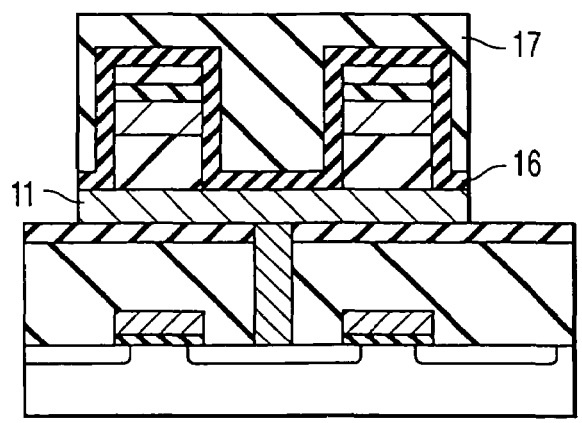
FIG. 6 is a cross sectional view showing the process step following the step shown in FIG. 5.
Figure 7:
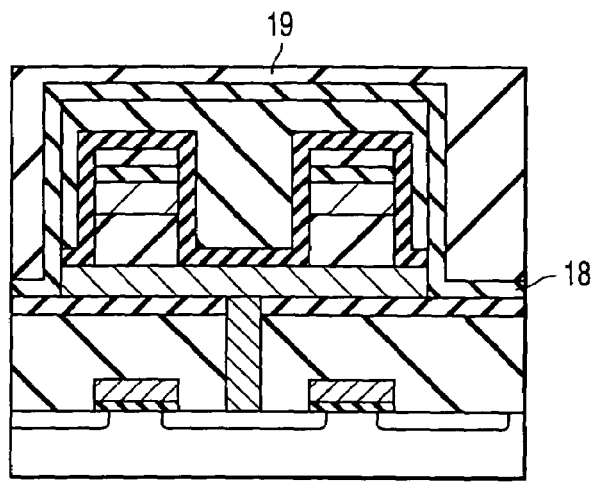
FIG. 7 is a cross sectional view showing the process step following the step shown in FIG. 6.
Figure 8:
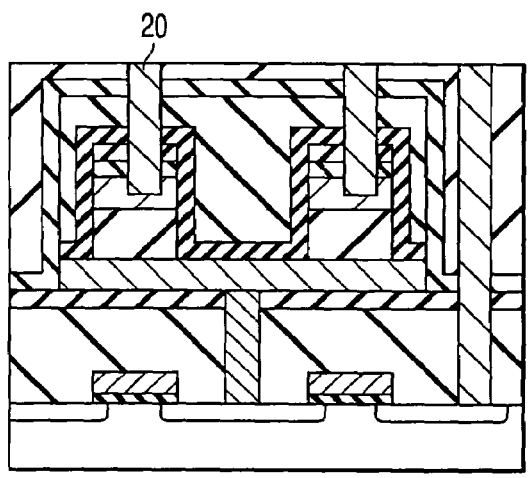
FIG. 8 is a cross sectional view showing the process step following the step shown in FIG. 7.

In the next step, a hydrogen barrier film 16 and a hard mask 17 are formed on the entire surface, followed by the planarizing treatment by CMP. Further, an ordinary lithography process is applied so as to etch selectively the lower electrode 11, as shown in FIG. 6. Still further, the entire structure is covered with a hydrogen barrier film 18, followed by laminating an interlayer insulating film 19 on the hydrogen barrier film 18 as shown in FIG. 7. It is possible to use $Al_2O_3$ for forming each of the hydrogen barrier films 16 and 18 as in the formation of the hydrogen barrier film 14. Also, TEOS can be used for forming the interlayer insulating film 19 as in the formation of, for example, the hard mask. Finally, a metal wiring 20 connected to the upper electrode of the capacitor and to the transistor is formed as shown in FIG. 8.

In the structure shown in the drawing, the ARC 7 that is impermeable to hydrogen is formed below the lower electrode 11 of the capacitor in contact with the lower electrode, and the hydrogen barrier films 14, 16 and 18 are formed above the capacitor. With this particular construction, it is possible to avoid the damage caused by hydrogen coming from below and above the capacitor, so as to make it possible to protect the capacitor. In the manufactured semiconductor device, it is reasonable to state that the ARC 7 acts as a capacitor protection film.

In other words, the semiconductor device manufactured by the method according to embodiment 1 of the present invention comprises the capacitor protection film that is positioned between the insulating film formed of TEOS and the lower electrode 11 of the capacitor. The capacitor protection film is used as an anti-reflection layer, which is formed in the under layer of the resist pattern, in the lithography process for forming a hole in the insulating film. It follows that the capacitor protection film also performs the function of preventing the reflection of the exposure light beam in the light exposure step. In addition, the anti-reflection layer, which is impermeable to hydrogen, also performs the function of a hydrogen barrier film. It follows that, even if hydrogen is generated in the process of forming a wiring, it is impossible for the hydrogen thus generated to permeate through the insulating film (TEOS film) to the capacitor. Since the anti-reflection layer for preventing the reflection of the exposure light beam also acts as a hydrogen barrier film, it is unnecessary to separately form a hydrogen barrier film between the TEOS film and the lower electrode, which simplifies the manufacturing process and lowers the manufacturing cost.

Embodiment 2

It is possible to use a conductive material for forming an ARC, which is impermeable to hydrogen and which is formed between the lower electrode of the capacitor and the TEOS film. The particular construction will now be exemplified with reference to FIGS. 9 to 12.

Figure 9:
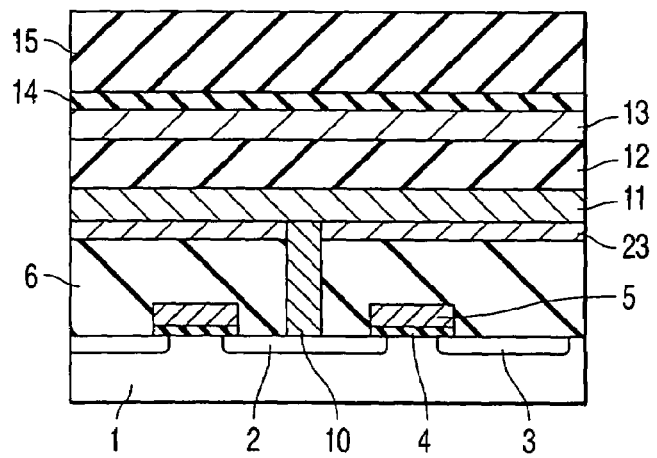
FIG. 9 is a cross sectional view showing a process step included in the manufacturing method of a semi-conductor device for embodiment 2 of the present invention.

First of all, the construction shown in FIG. 9 is formed by the method similar to that for embodiment 1 described above, except that the ARC that is impermeable to hydrogen is formed by using a conductive material. The conductive material that can be used for forming the ARC includes, for example, carbon, chromium nitride such as CrN, titanium nitride such as TiN, tantalum nitride such as TaN, aluminum nitride such as AlN, $TiAl_xN_y$, $TaAl_xN_y$, $TiSi_xN_y$, $AlSi_xN_y$, (where x and y denote the component ratio), and silicon carbide such as SiC. It is also possible to use silicon oxycarbide such as SiOC, which is a conductive material, for forming the ARC.

Figure 10:
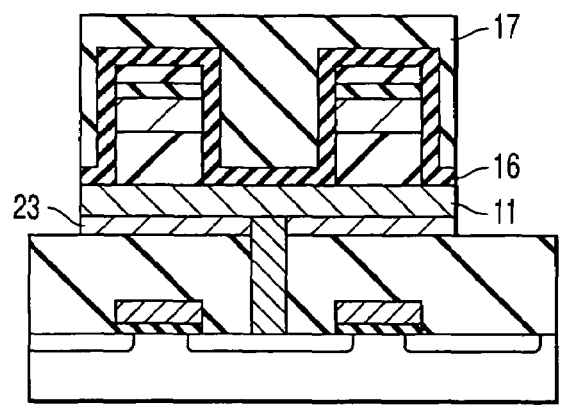
FIG. 10 is a cross sectional view showing the process step following the step shown in FIG. 9.
Figure 11:
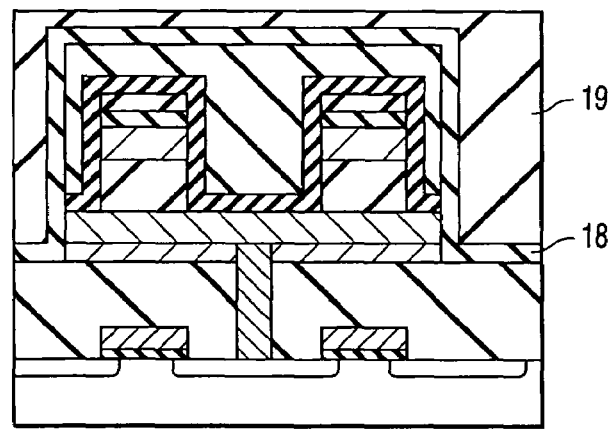
FIG. 11 is a cross sectional view showing the process step following the step shown in FIG. 10.
Figure 12:
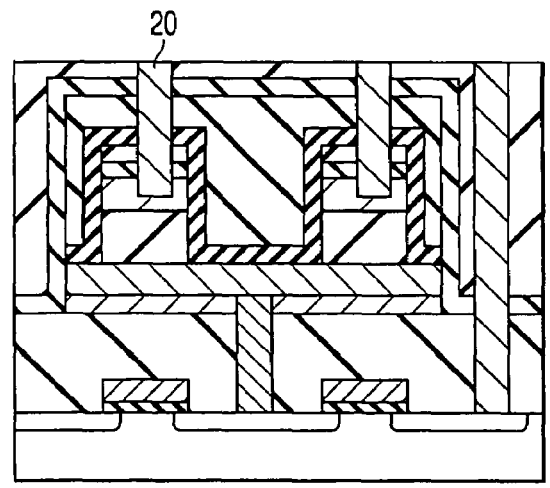
FIG. 12 is a cross sectional view showing the process step following the step shown in FIG. 11.

In the next step, the hard mask 15, the hydrogen barrier film 14, the upper electrode 13 and the ferroelectric film 12 are processed by the method similar to that employed in embodiment 1 so as to pattern the capacitor. Then, a hydrogen barrier film 16 and a hard mask 17 are deposited on the entire surface. After the planarizing treatment by CMP, an ordinary lithography process is applied so as to etch selectively the lower electrode 11 and the ARC 23, as shown in FIG. 10. Further, the entire surface is covered with a hydrogen barrier film 18, followed by laminating an interlayer insulating film 19 on the hydrogen barrier film 18, as shown in FIG. 11. In the construction for embodiment 2, it is necessary for the hydrogen barrier film 18 covering the capacitor to be formed in contact with the sidewall of the ARC 23. Finally, a metal wiring 20 is formed as shown in FIG. 12. The ARC 23, which is conductive, can also be used as the lower electrode 11.

In the structure shown in the drawing, the ARC 23 that is impermeable to hydrogen is formed in a lower portion in contact with the lower electrode 11 of the capacitor, with the result that it is impossible for hydrogen to migrate from below the capacitor to the capacitor. In addition, the hydrogen barrier films 14, 16 and 18 are formed above the capacitor. It follows that it is also impossible for hydrogen to migrate from above the capacitor to the capacitor. Such being the situation, it is possible to avoid the damage done by hydrogen coming from below and above the capacitor, thus protecting the capacitor. Since hydrogen does not migrate to the ferroelectric film included in the capacitor, it is impossible for oxygen contained in the crystal to be extracted. It follows that it is possible to obtain a ferroelectric capacitor sufficiently capable of bringing about spontaneous polarization.

Incidentally, it is also possible to apply etching to the ARC made of an insulating material and positioned between the TEOS film and the lower electrode by the method described above.

Embodiment 3

It is possible to form an ARC that is impermeable to hydrogen on the upper electrode of the capacitor. The particular construction will now be exemplified with reference to FIGS. 13 to 19.

Figure 13:
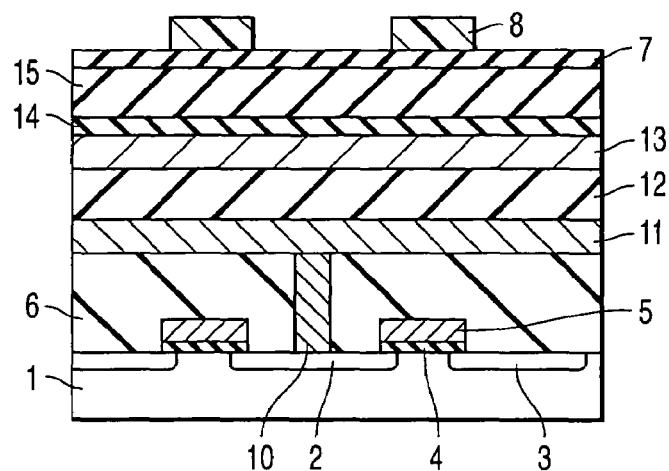
FIG. 13 is a cross sectional view showing a process step included in the manufacturing method of a semiconductor device for embodiment 3 of the present invention.

In the first step, the interlayer insulating film 6, the lower electrode 11, the ferroelectric film 12, the upper electrode 13, the hydrogen barrier film 14 and the hard mask 15 are formed successively on the semiconductor substrate 1 having a transistor formed therein, as shown in FIG. 13. Each of the electrodes and the films noted above can be formed by using the material described previously by a method similar to the method described previously.

To be more specific, the ARC 7 that is impermeable to hydrogen is formed by using an insulating material on the hard mask 15, followed by forming the resist pattern 8 on the ARC 7. Each of the ARC 7 and the resist pattern 8 can be formed by using the material described previously by a method similar to the method described previously.

Figure 14:
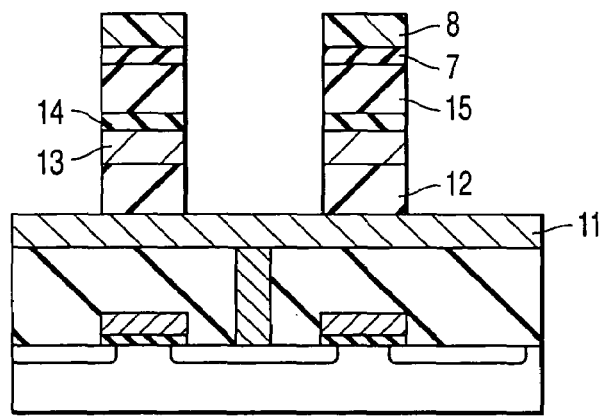
FIG. 14 is a cross sectional view showing the process step following the step shown in FIG. 13.
Figure 15:
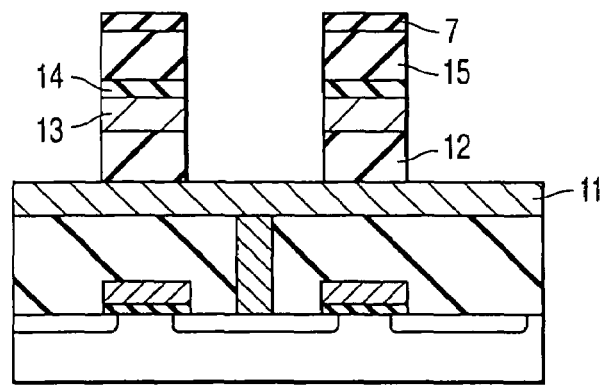
FIG. 15 is a cross sectional view showing the process step following the step shown in FIG. 14.

In the next step, the ARC 7, the hard mask 15, the hydrogen barrier film 14, the upper electrode 13, the ferroelectric film 12 and the lower electrode 11 are processed by an ordinary lithography process with the resist pattern 8 used as a mask, so as to obtain a patterned capacitor as shown in FIG. 14. Further, the resist pattern 8 is peeled off by an ashing treatment so as to expos the ARC 7 to the outside, as shown in FIG. 15.

Since the resist is an organic material, hydrogen is generated in the ashing process. However, the presence of the ARC 7 that is impermeable to hydrogen prevents the generated hydrogen from migrating to the hard mask film 15. As a result, it is possible to prevent hydrogen from migrating to the ferroelectric capacitor, with the result that it is possible to avoid damage to the ferroelectric capacitor.

Figure 16:
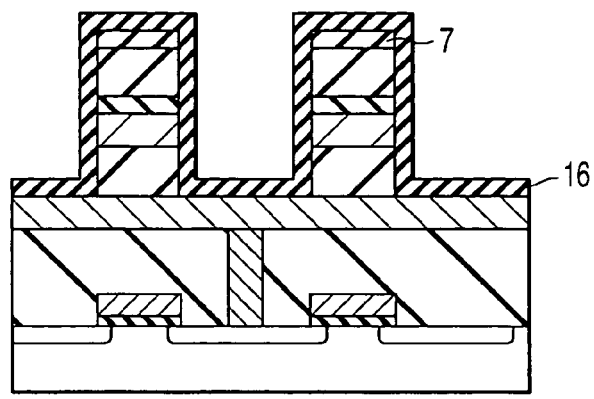
FIG. 16 is a cross sectional view showing the process step following the step shown in FIG. 15.

As shown in FIG. 16, a hydrogen barrier film 16 is formed on the entire surface by means of vapor deposition of $Al_2O_3$. In embodiment 3, the ARC 7 that is impermeable to hydrogen is left unremoved below the hydrogen barrier film 16. It thus follows that it is possible to more effectively prevent the damage done by the hydrogen generated in the subsequent steps.

Figure 17:
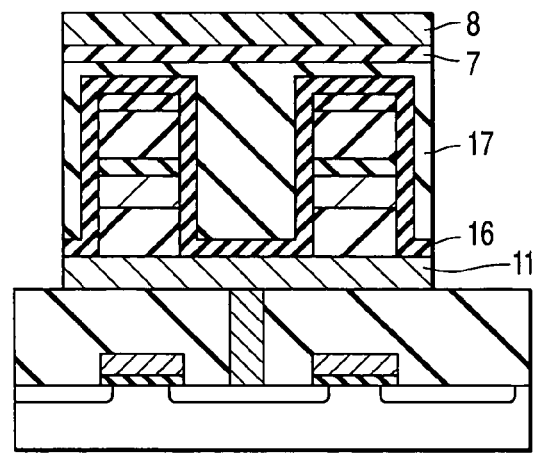
FIG. 17 is a cross sectional view showing the process step following the step shown in FIG. 16.

In the next step, the hard mask 17 and the ARC 7 that is impermeable to hydrogen are formed successively, followed by forming a resist pattern 8. Then, the ARC 7, the hard mask 17, the hydrogen barrier film 16 and the lower electrode 11 are etched successively as shown in FIG. 17 with the resist pattern 8 used as a mask. In the structure shown in FIG. 17, the lower electrode 11 is shared by the two capacitors. However, it is also possible for the lower electrode to be formed separately for each capacitor.

Figure 18:
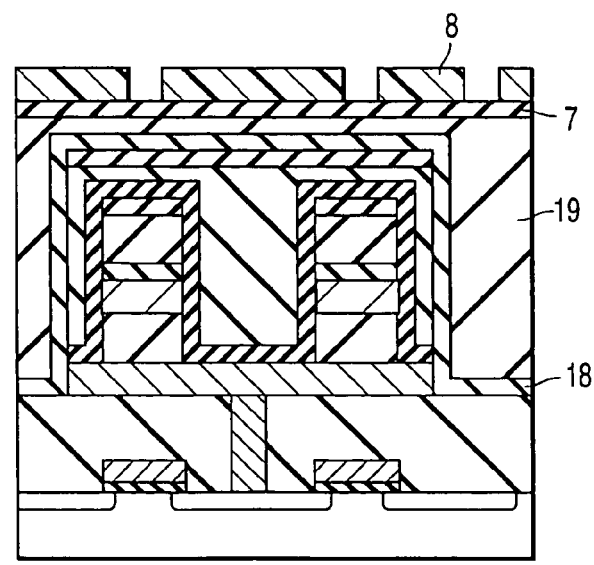
FIG. 18 is a cross sectional view showing the process step following the step shown in FIG. 17.
Figure 19:
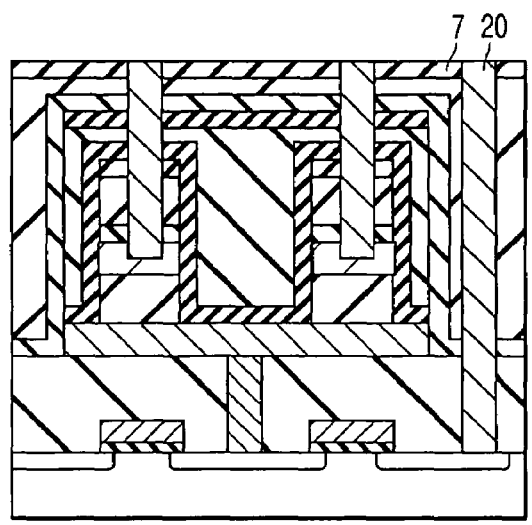
FIG. 19 is a cross sectional view showing the process step following the step shown in FIG. 18.

Further, after a hydrogen barrier film 18 is formed to cover the entire surface, an interlayer insulating film 20, the ARC 7 and the resist pattern 8 are formed successively, as shown in FIG. 18. Finally, connecting holes for forming wirings to the upper electrode, the lower electrode and the transistor are formed by the lithography process, followed by forming a metal wiring 20 as shown in FIG. 19.

In embodiment 3, the ARC 7 that is impermeable to hydrogen is left unremoved as much as possible even after the processing of the substrate. As a result, it is possible to more effectively suppress potential damage to the capacitor caused by hydrogen. Since hydrogen does not migrate to the ferroelectric film included in the capacitor, the oxygen contained in the crystal is not extracted. It follows that it is possible to obtain a ferroelectric capacitor sufficiently capable of bringing about spontaneous polarization.

Figure 20A:
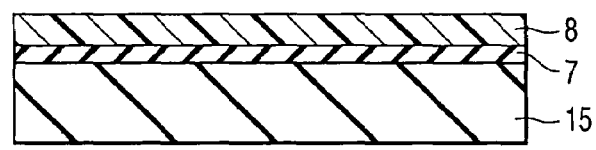
FIGS. 20A and 20B schematically show the function of ARC for the embodiment of the present invention.
Figure 20B:
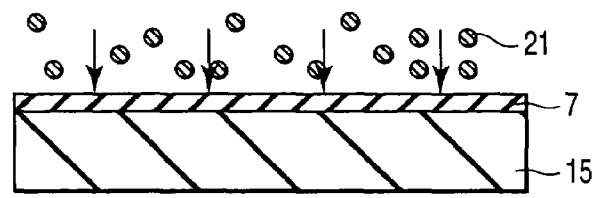

The effect produced by the ARC 7 that is impermeable to hydrogen will now be described with reference to FIGS. 20A and 20B. In embodiment 3, the ARC 7 and the resist pattern 8 are formed on the hard mask film 15, as shown in FIG. 20A. Then, the resist pattern 8 is removed by an ashing treatment. During this ashing treatment, hydrogen 21 is generated as shown in FIG. 20B. Since the ARC 7 exposed to hydrogen 21 is formed of a material having a very low hydrogen diffusion coefficient, hydrogen does not reach the hard mask film 15. It thus follows that it is possible to avoid the potential damage to the capacitor, caused by hydrogen, even if the capacitor is formed in the subsequent steps on the hard mask 15.

Figure 21A:
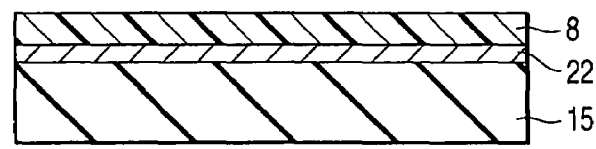
FIGS. 21A and 21B schematically show the function of the conventional ARC.
Figure 21B:
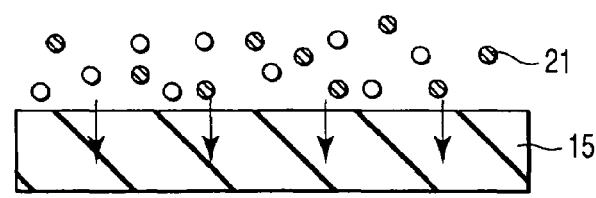

FIGS. 21A and 21B collectively cover the case where the conventional organic anti-reflection layer is formed below the resist pattern. An organic anti-reflection layer 22 shown in FIG. 21A is removed together with the resist pattern 8 during the ashing process, with the result that hydrogen is generated. If the organic anti-reflection layer 22 is removed, hydrogen 21 easily migrates to the hard mask film 15 as shown in FIG. 21B. Such being the situation, hydrogen present in the hard mask damages the capacitor formed in the subsequent process steps. In the method according to embodiment 3 of the present invention, however, the ARC that is impermeable to hydrogen is formed between the hard mask and the lower electrode so as to avoid the problem described above.

Since hydrogen does not migrate to the ferroelectric film included in the capacitor in the method of the present invention, oxygen contained in the crystal is not extracted. It follows that it is possible to obtain a ferroelectric capacitor sufficiently capable of bringing about spontaneous polarization.

Incidentally, the material forming the ARC 7 is impermeable to hydrogen. Therefore, it is possible to form the hydrogen barrier films 14, 16 and 18 by using the material forming the ARC 7. It suffices to form a film and perform the etching under the conditions that are determined in accordance with the material used. The effect of protecting the capacitor from hydrogen is also obtained in this case. In addition, this is advantageous in that a high reliability can be ensured.

Embodiment 4

Where the ARC that is impermeable to hydrogen is formed by using an insulating material, it is possible to form the ARC in a manner to surround the capacitor. The particular case will now be exemplified with reference to FIGS. 22 to 26.

Figure 22:
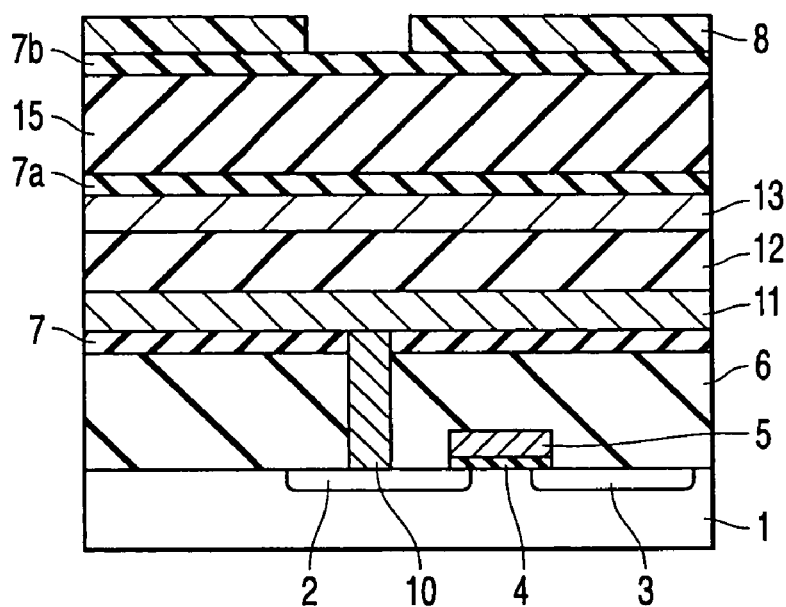
FIG. 22 is a cross sectional view showing a process step included in the manufacturing method of a semiconductor device for embodiment 4 of the present invention.

In the first step, the structure as shown in FIG. 3 is obtained by the method similar to that employed in embodiment 1, followed by forming successively the lower electrode 11, the ferroelectric film 12, the upper electrode 13, an ARC 7a, the hard mask 15 and an ARC 7b, and subsequently forming the resist pattern 8, as shown in FIG. 22. It should be noted that the ARC 7a formed between the upper electrode 13 and the hard mask 15 acts as a hydrogen barrier film.

Figure 23:
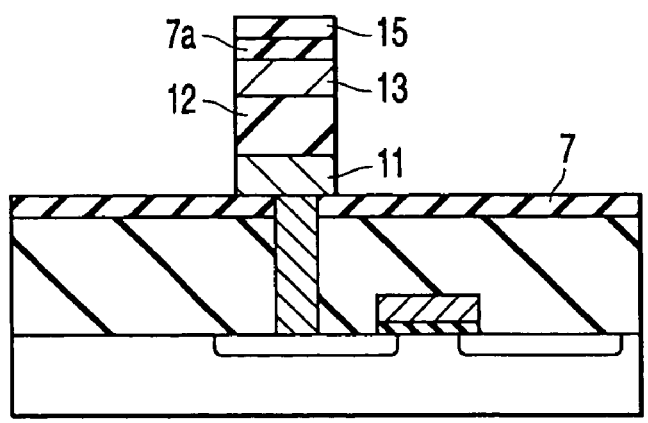
FIG. 23 is a cross sectional view showing the process step following the step shown in FIG. 22.

The ARC 7b, the hard mask 15, the ARC 7a, the upper electrode 13, the ferroelectric film 12 and the lower electrode 11 are processed by the ordinary lithography process. Further, the upper ARC 7b is removed to expose the hard mask 15 to the outside so as to obtain a patterned capacitor, as shown in FIG. 23. In this step, the lower electrode is patterned to form a single capacitor. In the structure shown in FIG. 23, the ARC 7 that is in contact with the plug 10 is not etched. However, it is possible to etch the ARC 7.

Figure 24:
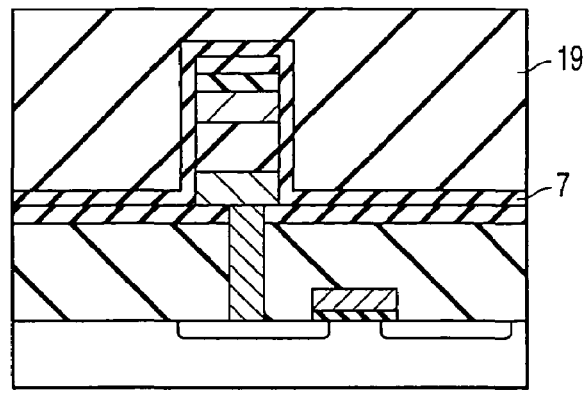
FIG. 24 is a cross sectional view showing the process step following the step shown in FIG. 23.
Figure 25:
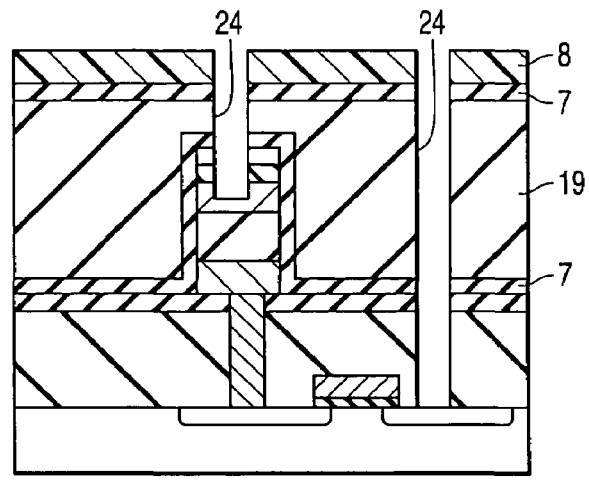
FIG. 25 is a cross sectional view showing the process step following the step shown in FIG. 24.
Figure 26:
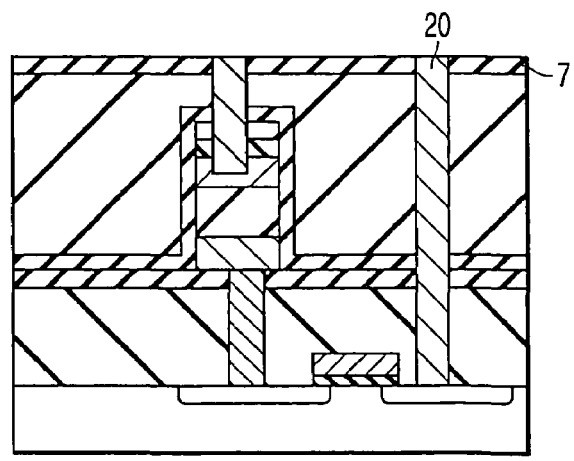
FIG. 26 is a cross sectional view showing the process step following the step shown in FIG. 25.

After the ARC 7 is formed to cover the entire surface, an interlayer insulating film 19 is formed on the ARC 7 as shown in FIG. 24. The ARC 7 formed in this step acts as a hydrogen barrier film. Then, another ARC 7 and a resist pattern 8 are formed successively on the interlayer insulating film 19, followed by forming connecting holes for forming wirings connected to the upper electrode, the lower electrode and the transistor by the lithography process as shown in FIG. 25. Finally, a metal wiring 20 is formed as shown in FIG. 26.

In the structure shown in the drawing, the entire region of the capacitor is surrounded by the ARC 7 that is impermeable to hydrogen so as to make it possible to sufficiently prevent damage to the capacitor by hydrogen. Since hydrogen does not migrate to the ferroelectric film included in the capacitor, oxygen contained in the crystal is not extracted. It follows that it is possible to obtain a ferroelectric capacitor sufficiently capable of bringing about spontaneous polarization.

Embodiment 5

Where the ARC that is impermeable to hydrogen is formed by using a conductive material, it is possible to use the ARC as a part of the electrode. The particular case will now be exemplified with reference to FIGS. 27 to 32.

Figure 27:
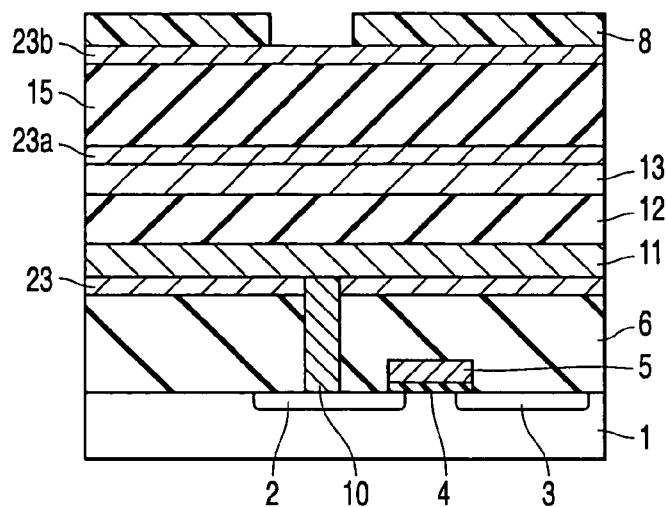
FIG. 27 is a cross sectional view showing a process step included in the manufacturing method of a semiconductor device for embodiment 5 of the present invention.

In the first step, each of the layers is laminated as shown in FIG. 27 by a method similar to the method employed in embodiment 4 described above, except that a conductive material is used for forming an ARC 23 that is impermeable to hydrogen. To be more specific, an interlayer insulating film 6 made of, for example, TEOS and the ARC 23 made of a conductive material are formed successively on the semiconductor substrate 1 having a transistor formed therein. Then, a lower electrode 11, a ferroelectric film 12, an upper electrode 13, an ARC 23a, a hard mask 15, and an ARC 23b are formed successively on the ARC 23, followed by forming a resist pattern 8 on the ARC 23b. It should be noted that the ARC 23a formed between the upper electrode 13 and the hard mask 15 acts as a hydrogen barrier film.

Figure 28:
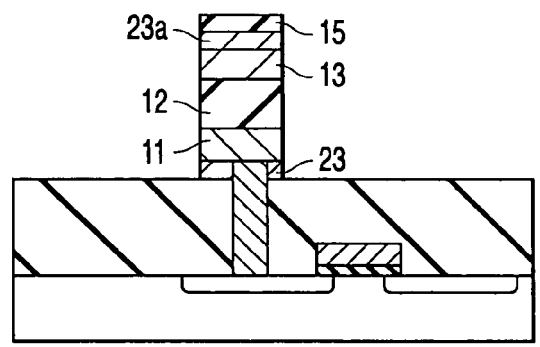
FIG. 28 is a cross sectional view showing the process step following the step shown in FIG. 27.

In the next step, the ARC 23b, the hard mask 15, the ARC 23a, the upper electrode 13, the ferroelectric film 12, the lower electrode 11, and the ARC 23 are processed by an ordinary lithography process. Further, the upper ARC 23b is removed so as to expose the hard mask 15 as shown in FIG. 28, thereby obtaining a patterned capacitor. In this step, a single lower electrode is patterned to form a single capacitor. In embodiment 5, it is necessary to etch the ARC 23 in contact with a plug 10, as shown in FIG. 28.

Figure 29:
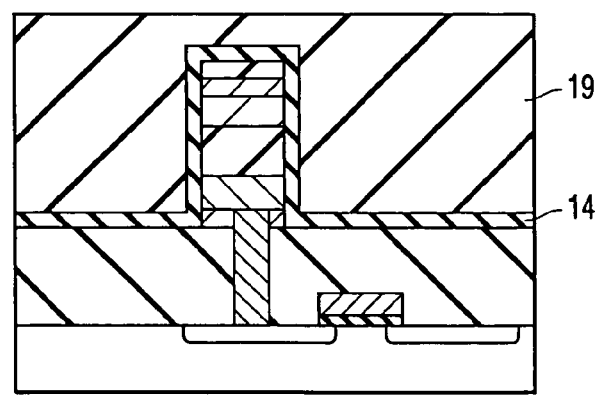
FIG. 29 is a cross sectional view showing the process step following the step shown in FIG. 28.
Figure 30:
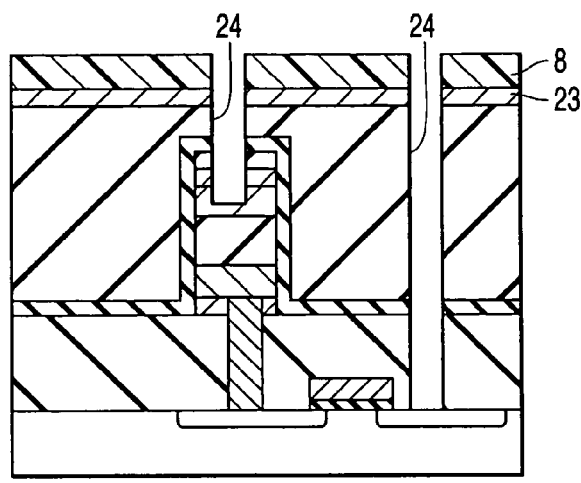
FIG. 30 is a cross sectional view showing the process step following the step shown in FIG. 29.
Figure 31:
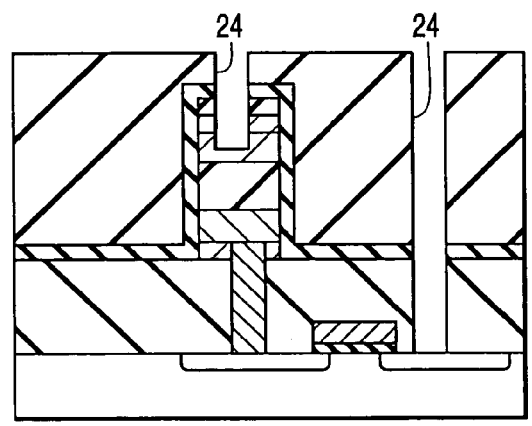
FIG. 31 is a cross sectional view showing the process step following the step shown in FIG. 30.
Figure 32:
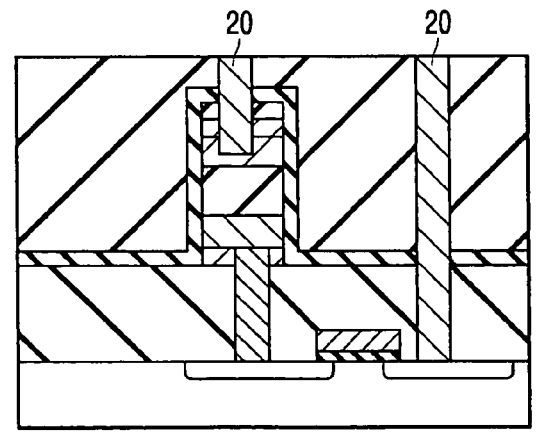
FIG. 32 is a cross sectional view showing the process step following the step shown in FIG. 31.

In the next step, a hydrogen barrier film 14 made of $Al_2O_3$ is formed on the entire surface, followed by forming an interlayer insulating film 19 on the hydrogen barrier film 14, as shown in FIG. 29. Further, an ARC 23 and a resist pattern 8 are formed on the interlayer insulating film 19, followed by forming connecting holes 24 for forming wirings connected to the upper electrode, the lower electrode and the transistor by the lithography process as shown in FIG. 30. Then, the ARC 23 is removed to expose the interlayer insulating film 19, as shown in FIG. 31. Finally, metal wirings 20 are formed as shown in FIG. 32.

In the structure shown in the drawing, hydrogen does not migrate to reach the ferroelectric film included in the capacitor, with the result that oxygen contained in the crystal is not extracted. It follows that it is possible to obtain a ferroelectric capacitor sufficiently capable of bringing about the spontaneous polarization. In addition, in the semiconductor device obtained by the method according to embodiment 5 of the present invention, the ARC that is impermeable to hydrogen constitutes a part of the upper electrode and the lower electrode of the capacitor so as to obtain a merit that a high reliability can be ensured.

Embodiment 6

Where the ARC that is impermeable to hydrogen is formed by using an insulating material, it is possible for the ARC to perform the function of a hard mask. This will now be exemplified with reference to FIGS. 33 to 37.

Figure 33:
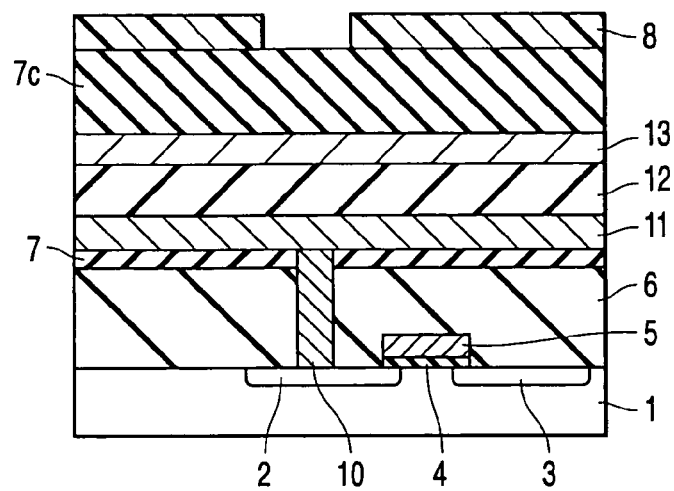
FIG. 33 is a cross sectional view showing a process step included in the manufacturing method of a semiconductor device for embodiment 6 of the present invention.
Figure 34:
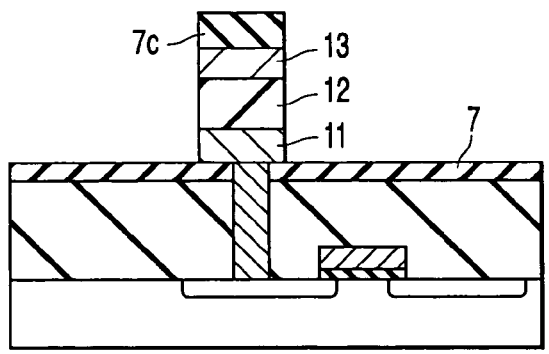
FIG. 34 is a cross sectional view showing the process step following the step shown in FIG. 33.

After the structure shown in FIG. 3 is obtained by a method similar to the method employed in embodiment 1, a lower electrode 11, a ferroelectric film 12, an upper electrode 13 and an ARC 7c are formed successively on the ARC 7, followed by forming a resist pattern 8 on the ARC 7c as shown in FIG. 33. As already described, the ARC 7 is impermeable to hydrogen and, thus, even if hydrogen is generated during the ashing process, the hydrogen thus generated does not migrate to reach the ferroelectric film 12. It should also be noted that the ARC 7c formed on the upper electrode 13 acts as a hydrogen barrier film.

In the next step, the ARC 7c, the upper electrode 13, the ferroelectric film 12, and the lower electrode 11 are processed by an ordinary lithography process to obtain a patterned capacitor. In the structure shown in FIG. 34, the ARC 7 in contact with a plug 10 is not etched. However, it is possible to etch the ARC 7 depending on the situation.

Figure 35:
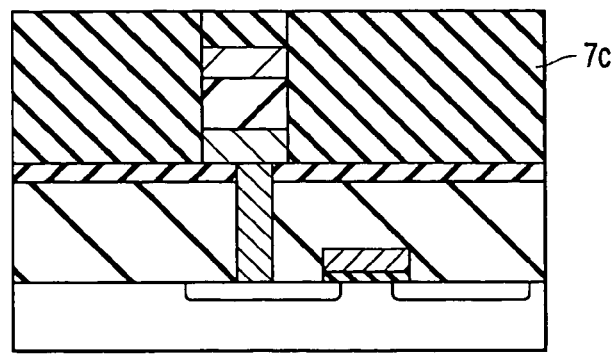
FIG. 35 is a cross sectional view showing the process step following the step shown in FIG. 34.
Figure 36:
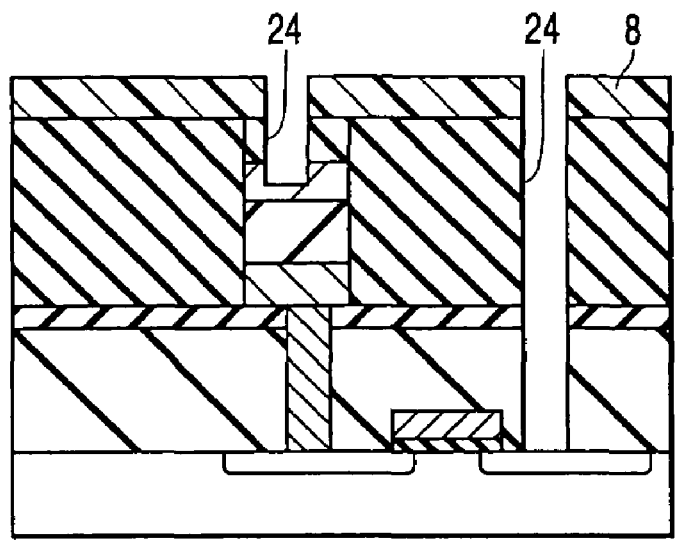
FIG. 36 is a cross sectional view showing the process step following the step shown in FIG. 35.
Figure 37:
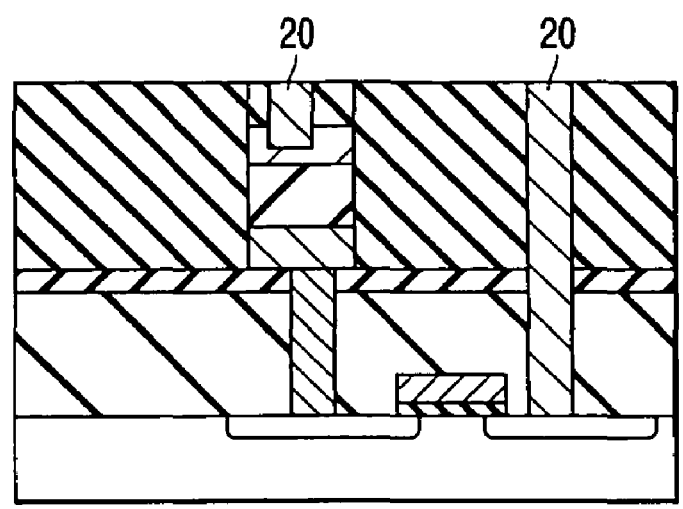
FIG. 37 is a cross sectional view showing the process step following the step shown in FIG. 36.

In the next step, the ARC 7c is formed in a manner to cover the capacitor, followed by planarizing the ARC 7c as shown in FIG. 35. The ARC 7c thus formed acts as a hard mask. Then, a resist pattern 8 is formed, followed by forming connecting holes 24 for forming wirings connected to the upper electrode, the lower electrode and the transistor by the lithography process as shown in FIG. 36. Finally, a metal wiring 20 is formed as shown in FIG. 37.

In the structure shown in the drawing, hydrogen does not migrate to the ferroelectric film included in the capacitor, with the result that oxygen contained in the crystal is not extracted. It follows that it is possible to obtain a ferroelectric capacitor sufficiently capable of bringing about spontaneous polarization. In addition, in embodiment 6 of the present invention, the ARC that is impermeable to hydrogen also acts as a hard mask. It thus follows that it is possible to markedly simplify the film-forming process.

The ferroelectric memories to which the technical idea of the present invention can be applied include structures of, for example, a chain FeRAM, a COP type and an off-set type.

The chain FeRAM is a memory which consists of series connected memory cells each having a transistor having a source terminal and a drain terminal and a ferroelectric capacitor in between the two terminals, hereafter named "Series connected TC unit type ferroelectric RAM".

The COP type represents the construction in which a plug made of W or Si is formed on an active region of a transistor, and a capacitor is arranged right above the plug. In the COP type, it is possible for the plug to be oxidized in the step of forming a ferroelectric film so as to increase the contact resistance or to bring about the peeling of the film. However, the COP type permits diminishing the cell area and, thus, is advantageous for improving the degree of integration.

Further, the off-set type can be manufactured by connecting the upper electrode to the active region of the transistor by a plug after formation of a capacitor. In the off-set type, the improvement in the degree of integration is said to be difficult because it is difficult to decrease the cell area. However, since the plug is not affected by the heat treating process for forming the ferroelectric film, the burden given to the manufacturing process is small.

As described above, according to an aspect of the present invention, provided is a method of manufacturing a semiconductor device comprising a ferroelectric capacitor capable of bringing about a sufficiently large spontaneous polarization.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
    forming an insulating film above a semiconductor substrate having an element formed thereon;
    successively depositing a lower electrode, a ferroelectric film and an upper electrode on the insulating film to form a ferroelectric capacitor;
    forming an anti-reflection layer that is impermeable to hydrogen on the upper electrode, the anti-reflection layer comprising a layer formed of at least one material selected from the group consisting of $AlSi_xO_y$, aluminum nitride, and $TiAl_xN_y$, (where x and y denote the component ratio);
    forming a resist pattern directly on the anti-reflection layer;
    patterning the ferroelectric capacitor with the resist pattern used as a mask; and
    removing the resist pattern.

2. The method according to claim 1, wherein the resist pattern is formed by forming a resist film, followed by applying a light exposure and the development to the resist film, the anti-reflection layer exhibiting optical constants including a refractive index n falling within a range of between 1.0 and 2.2 and an attenuation coefficient k falling within a range of between 0.2 and 1.0 under the wavelength of the light for the light exposure.

3. The method according to claim 1, wherein the anti-reflection layer is formed by a sputtering method.

4. The method according to claim 1, wherein the anti-reflection layer is formed in a thickness not smaller than 50 nm.

5. The method according to claim 1, further comprising forming a conductive film on the insulating film before formation of the lower electrode, the conductive film containing at least one selected from the group consisting of carbon, chromium nitride, titanium nitride, tantalum nitride, aluminum nitride, $TiAl_xN_y$, $TaAl_xN_y$, $TiSi_xN_y$, $AlSi_xN_y$ (where x and y denote the component ratio), and silicon oxycarbide.

6. The method according to claim 1, further comprising forming a reduction resistant film on the ferroelectric capacitor.

7. The method according to claim 1, wherein the anti-reflection layer is formed of an insulating material.

8. The method according to claim 1, wherein the anti-reflection layer is formed of a conductive material.

* * * * *